United States Patent [19]

Bynum et al.

[11] 4,336,507

[45] Jun. 22, 1982

[54] CURRENT OUTPUT RELAXATION OSCILLATOR

[75] Inventors: Byron G. Bynum; Robert B. Jarrett, both of Tempe, Ariz.

[73] Assignee: Motorola, Inc., Schaumburg, Ill.

[21] Appl. No.: 229,485

[22] Filed: Jan. 29, 1981

[51] Int. Cl.³ .......................................... H03K 3/282
[52] U.S. Cl. ................................ 331/108 D; 331/111
[58] Field of Search ............... 331/108 C, 108 D, 111, 331/143, 113 R

[56] References Cited

U.S. PATENT DOCUMENTS

| | | | |
|---|---|---|---|
| 3,886,485 | 5/1975 | Takahashi | 331/111 |
| 3,924,202 | 12/1975 | Craft | 331/111 |
| 4,263,567 | 4/1981 | Astle | 331/111 |
| 4,292,604 | 9/1981 | Embree et al. | 331/111 |

*Primary Examiner*—Siegfried H. Grimm

*Attorney, Agent, or Firm*—Vincent B. Ingrassia

[57] ABSTRACT

An integrated circuit current-output relaxation oscillator utilizes an internal or external capacitor which is alternately charged from $+V_{BE}$ to a predetermined upper trip point and then discharged to $+V_{BE}$. A control current proportional to the voltage across the capacitor is generated and compared with a reference current. When the control current achieves a predetermined value with respect to the reference current, a transistor is turned on permitting the capacitor to discharge to $+V_{BE}$. The control current is generated by the same current mirror circuit which generates the oscillating output current and is either equal or proportional thereto. Therefore, the magnitude of the oscillating output current is dominantly proportional to the magnitude of the reference current, and the frequency of oscillation is dominantly dependent on passive components; i.e. a resistor and a capacitor.

16 Claims, 1 Drawing Figure

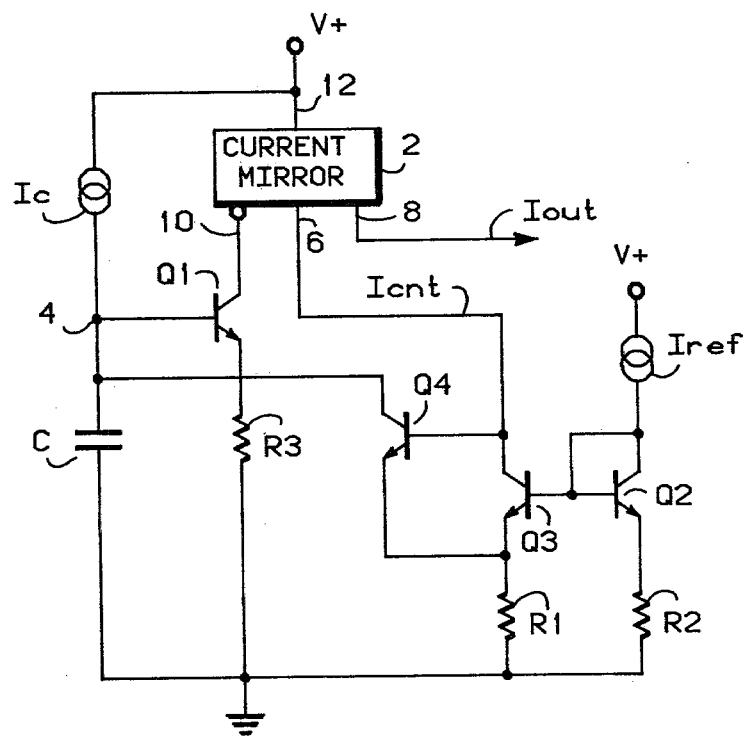

CURRENT OUTPUT RELAXATION OSCILLATOR

BACKGROUND OF THE INVENTION

This invention relates generally to oscillator circuits and, more particularly, to an integrated circuit current output oscillator which is simple, relatively insensitive to temperature and which occupies a small amount of semiconductor area.

Relaxation type oscillator circuits which are responsive to voltage trip points and which generate an oscillating output voltage signal are well-known. The conventional method of producing an oscillating current is to first generate an oscillating voltage and then perform a voltage-to-current conversion. A problem associated with this approach, however, may require excessive semiconductor area and may result in the introduction of additional error during the conversion process.

SUMMARY OF THE INVENTION

It is an object of the present invention to provide an improved oscillator circuit.

It is a further object of the present invention to provide a current output oscillator which is simple and exhibits an output amplitude and frequency which is relatively insensitive to temperature.

According to a broad aspect of the invention there is provided a circuit for generating an oscillating output current, comprising: a capacitor; first means coupled to said capacitor for charging said capacitor; second means coupled to said first means and responsive to voltage across said capacitor for generating said output current and a control current proportional to said output current; and third means coupled to said second means and adapted to receive a reference current for providing said capacitor with a discharge path when said control current exceeds some predetermined value with respect to said reference current.

According to a further aspect of the invention there is provided an integrated circuit adapted to be coupled to an external capacitor for generating an oscillating output current comprising: first means adapted to be coupled to said capacitor for charging said capacitor; second means coupled to said first means and responsive to voltage across said capacitor for generating said output current and a control current proportional to said output current; and third means coupled to said second means and adapted to receive a reference current for providing said capacitor with a discharge path when said control current exceeds some predetermined value with respect to said reference current.

BRIEF DESCRIPTION OF THE DRAWINGS

The above and other objects, features and advantages of the present invention will be more clearly understood from the following detailed description taken in conjunction with the accompanying drawing which is a schematic diagram of the inventive current output oscillator circuit.

DESCRIPTION OF THE PREFERRED EMBODIMENT

The sole FIGURE is a schematic diagram of the inventive current output oscillator circuit. A first current source $I_C$ is coupled between a first voltage terminal (V+) and a first terminal of capacitor C which may be internal or external to the integrated circuit chip. The other terminal of capacitor C is coupled to a second voltage supply terminal (e.g. ground). A first transistor Q1 has a base coupled to node 4 which is the junction between current source $I_C$ and capacitor C and has a collector coupled to the input of current mirror 2. The emitter of transistor Q1 is coupled via resistor R3 to the second voltage terminal. A second transistor Q2 has its base and collector terminals adapted to receive a reference current $I_{REF}$. The emitter of transistor Q2 is coupled via resistor R2 to the second supply voltage terminal. A third transistor Q3 has a base terminal coupled to the base of transistor Q2, an emitter coupled via resistor R1 to the second supply voltage terminal and has a collector coupled to output 6 of current mirror circuit 2. A fourth transistor Q4 has at least one emitter coupled to the emitter of transistor Q3, a base coupled to the collector of transistor Q3, and a collector coupled to node 4. The oscillating current output appears at output 8 of current mirror 2. While current mirror 2 is shown only as a block having an input 10, outputs 6 and 8, and a power supply input 12, such circuits are well-known in the art and a further discussion is not deemed necessary.

The oscillator is not of the relaxation type; i.e. the output current rises to a peak level and then is rapidly reset (relaxed) to an initial level. Let us first assume the transistor Q4 is off and that current source $I_C$ (which may be nothing more than a resistor to V+) is supplying current to capacitor C. The voltage across capacitor C (and therefore on the base of transistor Q1) begins to rise. This develops a voltage across resistor R3 which in turn causes a collector current to flow in transistor Q1. Since the collector of transistor Q1 is coupled to input 10 of current mirror 2, the current is mirrored to output terminals 6 and 8 of current mirror 2 which correspond to a control current ($I_{CNT}$) and the output current of the circuit $I_{OUT}$ respectively. Thus, as the voltage across capacitor C rises, so does the output current $I_{OUT}$ and control current $I_{CNT}$.

Transistors Q2 and Q3 control the trip point of the circuit. Since at first, the voltage across capacitor C is very low, the reference current $I_{REF}$ is greater than the control current $I_{CNT}$. With $I_{CNT}$ very small, transistor Q3 is in saturation and transistor Q4 is off. Thus, the output current $I_{OUT}$ and the control current $I_{CNT}$ will continue to rise as capacitor C is charged at a rate determined by the values of $I_C$ and C; i.e. $dv/dt = I_C/C$.

When the voltage across capacitor C is sufficient to cause the control current $I_{CNT}$ to exceed the collector current of transistor Q3, transistor Q4 will turn on. Since transistors Q2 and Q3 and resistors R1 and R2 comprise a NPN mirror circuit, Q4 will turn on when the control current $I_{CNT}$ equals the reference current $I_{REF}$ as long as transistor Q2 is identical to transistor Q3 and R1 equals R2. Of course, by varying emitter areas of transistors Q2 and Q3 and by properly scaling the resistor values, the switching point of Q4 could occur when the control current $I_{CNT}$ was in some other way proportionally related to the reference current $I_{REF}$.

Since the emitter of transistor Q4 is coupled to the emitter of transistor Q3, as Q4 turns on harder the positive feedback will enhance the turning off of transistor Q3 thus quickly turning transistor Q3 off completely. Then, as transistor Q4 goes into saturation, capacitor C will discharge through transistor Q4 and resistor R1, with a time constant of approximately R1(C). By properly selecting the value of R1, the capacitor discharge time can be made very short compared to its charging time. Thus, the discharge time may be an insignificant factor in determining oscillator frequency.

The control current $I_{CNT}$ and the output current will fall as the voltage across the capacitor C is reset since the voltage across resistor R3 is also falling. It is important to note that the peak amplitude of the control current and of the output current is dependent only on the oscillator trip point which is set by the reference current $I_{REF}$ as described above. The peak output current is therefore directly proportional to $I_{REF}$ and is independent of other oscillator components. The temperature coefficient of $I_{OUT(peak)}$ is also directly proportional to the temperature coefficient of $I_{REF}$.

Transistor switch Q4 will remain on as long as $I_{CNT}$ provides adequate base current drive to Q4 and the capacitor discharge current through R1 is sufficient to bias transistor Q3 in the off state. Output current $I_{OUT}$, control current $I_{CNT}$ and therefore the base current of transistor Q4 will drop to a very low value when the voltage at the base of transistor Q1 drops to a level which biases Q1 near a turn-off condition; i.e., $V_{BEQ1(low)}$. In addition, the discharge current through R1 decreases to a level which allows transistor Q3 to turn on quickly due to regenerative feedback through transistor Q4. With transistor Q3 on and in saturation, transistor Q4 is again off and the above described cycle will be repeated.

The peak voltage across capacitor C at the oscillator trip point is equal to the base emitter voltage across transistor Q1 when it is on plus the peak voltage across resistor R3; i.e., $V_{BEQ1(high)} + V_{R3(peak)}$. The voltage across resistor R1 ($V_{R1}$) is approximately equal to the collector current through transistor Q1 times the resistance of R3; i.e., $I_{CQ1}(R3)$. Since $I_{CQ1}$ is directly proportional to the output current ($I_{OUT}$) through the action of current mirror circuit 2, $V_{R3(peak)}$ is directly proportional to $I_{REF}$; i.e., $V_{R3} = kI_{REF}R3$ where k is a constant. As described in a preceding paragraph, the capacitor voltage after reset is $V_{BEQ1(low)}$. During one capacitor discharge cycle, the capacitor voltage ($V_C$) traverses a voltage range equivalent to $$V_{BEQ1(high)} + V_{R3(peak)} - V_{BEQ1(low)}$$

From the well-known capacitor charging equation ($\Delta V/\Delta T = I/C$), the charging time is $\Delta T = \Delta V_C/(I_C/C)$ where $I_C$ is the current through capacitor C.

Since the capacitor charging time represents the major portion of the oscillator output period, the oscillator frequency is $f = 1/\Delta T$. Generally, the magnitude of $V_{BEQ1(high)} - V_{BEQ1(low)}$ is much lower than $V_{R3(peak)}$. Thus, the frequency equation may be simplified to $$f = I_C/kCI_{REF}R3$$

Furthermore, if $I_C$ and $I_{REF}$ are created by similar means, the equation may be further simplified to $$f = 1/CKR3$$

where $$K = kI_{REF}/I_C$$

which may be made constant with respect to temperature. It can now be seen that the frequency of oscillation is primarily dependent on the values of passive components R3 and C. The temperature coefficient of the frequency is then predictably dependent only on the temperature coefficient of components R3 and C.

Finally, for improved functionality, it would be possible to add, with minimal impact, an additional emitter to the transistor Q4 which would be on only during the reset time of the capacitor voltage. Such an output signal could prove valuable in the control of associated circuitry. Further, multiple oscillating output currents can be easily provided with additional current mirror outputs.

The above description is given by way of example only. Changes in form and details may be made by one skilled in the art without departing from the scope of the invention.

We claim:

1. A circuit for generating an oscillating output current, comprising:
    a capacitor;
    first means coupled to said capacitor for charging said capacitor;
    second means coupled to said first means and responsive to voltage across said capacitor for generating said output current and a control current proportional to said output current; and
    third means coupled to said second means and adapted to receive a reference current for providing said capacitor with a discharge path when said control current exceeds some predetermined value with respect to said reference current.

2. A circuit according to claim 1 wherein said first means charges said capacitor from a first predetermined voltage and wherein said third means discharges said capacitor to said predetermined voltage.

3. A circuit according to claim 2 wherein said second means comprises:
    a first transistor having a base coupled to said capacitor, and having a collector and an emitter;
    a first resistor coupled between the emitter of said first transistor and a first supply voltage terminal; and
    a current mirror circuit having an input coupled to the collector of said first transistor and having a first output for generating said oscillating output current and having a second output for generating said control current, said current mirror circuit adapted to be coupled to a second supply voltage terminal.

4. A circuit according to claim 3 wherein said predetermined voltage corresponds to the base emitter voltage of said first transistor.

5. A circuit according to claim 3 wherein said third means comprises:
    a second transistor having a collector coupled to its base, said collector being adapted to receive a reference current, and having an emitter;
    a second resistor coupled between the emitter of said second transistor and said first supply voltage terminal;
    a third transistor having a base coupled to the base of said second transistor, a collector coupled to the second output of said current mirror circuit and having an emitter;
    a third resistor coupled between the emitter of said third transistor and said first supply voltage terminal; and
    a fourth transistor having a base coupled to the collector of said third transistor, an emitter coupled to the emitter of said third transistor and a collector coupled to said capacitor, said fourth transistor turning on to discharge said capacitor through said third resistor when said control current exceeds the collector current of said third transistor.

6. A circuit according to claim 5 wherein said fourth transistor turns on when said control current exceeds said reference current.

7. A circuit according to claim 5 wherein said first means comprises a current source coupled between said capacitor and said second supply voltage terminal.

8. A circuit according to claim 7 wherein said current source is a resistor.

9. An integrated circuit adapted to be coupled to an external capacitor for generating an oscillating output current comprising:
- first means adapted to be coupled to said capacitor for charging said capacitor;
- second means coupled to said first means and responsive to voltage across said capacitor for generating said output current and a control current proportional to said output current; and
- third means coupled to said second means and adapted to receive a reference current for providing said capacitor with a discharge path when said control current exceeds some predetermined value with respect to said reference current.

10. A circuit according to claim 9 wherein said first means charges said capacitor from a first predetermined voltage and wherein said third means discharges said capacitor back to said predetermined voltage.

11. A circuit according to claim 10 wherein said second means comprises:
- a first transistor having a base for coupling to said capacitor, and having a collector and an emitter;
- a first resistor coupled between the emitter of said first transistor and a first supply voltage terminal; and
- a current mirror circuit having an input coupled to the collector of said first transistor and having a first output for generating said oscillating output current and having a second output for generating said control current, said current mirror circuit adapted to be coupled to a second supply voltage terminal.

12. A circuit according to claim 11 wherein said predetermined voltage corresponds to the base-emitter voltage of said first transistor.

13. A circuit according to claim 11 wherein said third means comprises a second transistor having a collector coupled to its base, said collector being adapted to receive a reference current, and having an emitter;
- a second resistor coupled between the emitter of said second transistor and said first supply voltage terminal;
- a third transistor having a base coupled to the base of said second transistor, a collector coupled to the second output of said current mirror circuit and having an emitter;
- a third resistor coupled between the emitter of said third transistor and said first supply voltage terminal; and
- a fourth transistor having a base coupled to the collector of said third transistor, an emitter coupled to the emitter of said third transistor and a collector for coupling to said capacitor, said fourth transistor turning on to discharge said capacitor through said third resistor when said control current exceeds the collector current of said third transistor.

14. A circuit according to claim 13 wherein said fourth transistor turns on when said control current exceeds said reference current.

15. A circuit according to claim 13 wherein said first means comprises a current source coupled to said second supply voltage terminal.

16. A circuit according to claim 15 wherein said current source is a resistor.

* * * * *